United States Patent
Chen et al.

(10) Patent No.: US 10,340,231 B2
(45) Date of Patent: Jul. 2, 2019

(54) SEMICONDUCTOR PACKAGE STRUCTURE AND METHOD FOR FORMING THE SAME

(71) Applicant: UNITED MICROELECTRONICS CORP., Hsinchu (TW)

(72) Inventors: Chun-Hung Chen, Tainan (TW); Chu-Fu Lin, Kaohsiung (TW); Ming-Tse Lin, Hsinchu (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 15/486,521

(22) Filed: Apr. 13, 2017

(65) Prior Publication Data
US 2018/0269167 A1   Sep. 20, 2018

(30) Foreign Application Priority Data
Mar. 15, 2017   (TW) .............................. 106108470 A

(51) Int. Cl.
| | |
|---|---|
| H01L 23/64 | (2006.01) |
| H01L 23/31 | (2006.01) |
| H01L 23/00 | (2006.01) |
| H01L 21/56 | (2006.01) |

(52) U.S. Cl.
CPC ........ *H01L 23/645* (2013.01); *H01L 23/3185* (2013.01); *H01L 21/568* (2013.01); *H01L 24/19* (2013.01); *H01L 2224/04105* (2013.01); *H01L 2224/96* (2013.01); *H01L 2924/1431* (2013.01); *H01L 2924/19042* (2013.01); *H01L 2924/19105* (2013.01); *H01L 2924/30107* (2013.01)

(58) Field of Classification Search
CPC ....................................................... H01L 23/66
See application file for complete search history.

(56) References Cited

U.S. PATENT DOCUMENTS

| | | |
|---|---|---|
| 8,513,812 B2 | 8/2013 | Lin |
| 9,209,131 B2 | 12/2015 | Gu et al. |
| 2011/0304012 A1* | 12/2011 | Kim ........................ H01L 21/56 257/531 |
| 2018/0025999 A1* | 1/2018 | Yu ......................... H01L 23/3114 257/428 |

* cited by examiner

*Primary Examiner* — Seahvosh Nikmanesh
(74) *Attorney, Agent, or Firm* — WPAT, PC

(57) ABSTRACT

A semiconductor package structure and a method for forming the same are disclosed. The semiconductor package structure includes a semiconductor die, a molding layer and an inductor. The semiconductor die includes an active surface, a back surface and a sidewall surface between the active surface and the back surface. The molding layer covers the back surface and the sidewall surface of the semiconductor die. The inductor is in the molding layer. The sidewall surface of the semiconductor die faces toward the inductor.

12 Claims, 3 Drawing Sheets

SEMICONDUCTOR PACKAGE STRUCTURE AND METHOD FOR FORMING THE SAME

BACKGROUND

This application claims the benefit of Taiwan application Serial No. 106108470, filed Mar. 15, 2017, the subject matter of which is incorporated herein by reference.

Technical Field

The disclosure relates to a semiconductor package structure and a method for forming the same, and more particularly to a semiconductor package structure having an inductor and a method for forming the same.

Description of the Related Art

A semiconductor package structure usually has a semiconductor die comprising an active element and a passive element such as an inductor disposed over the semiconductor die. However, the inductor occupies and limits a layout region for a redistribution layer electrically connected to the semiconductor die. On the other hand, an inductance performance of the inductor is limited due to the redistribution layer. A trade-off between the layout regions for the elements is difficult. In addition, the semiconductor die would be affected by a crosstalk from the inductor.

SUMMARY

The present disclosure provides a semiconductor package structure and a method for forming the same.

According to a concept of the present disclosure, a semiconductor package structure is provided. The semiconductor package structure comprises a semiconductor die, a molding layer and an inductor. The semiconductor die comprises an active surface, a back surface and a sidewall surface between the active surface and the back surface. The molding layer covers the back surface and the sidewall surface of the semiconductor die. The inductor is in the molding layer. The sidewall surface of the semiconductor die faces toward the inductor.

According to another concept of the present disclosure, a semiconductor package structure is disclosed. The semiconductor package structure comprises a molding layer, a semiconductor die, an inductor, and a redistribution layer. The molding layer has a first molding surface and a second molding surface opposing to the first molding surface. The semiconductor die has an active surface and is embedded in the molding layer. The inductor extends through the molding layer from the first molding surface to the second molding surface of the molding layer. The redistribution layer extends from the active surface of the semiconductor die and the second molding surface of the molding layer in a direction away from the first molding surface of the molding layer.

According to yet another concept of the present disclosure, a method for forming a semiconductor package structure is disclosed. The method comprises the following steps. A molding layer is formed to cover a semiconductor die. The molding layer has a first molding surface and a second molding surface opposing to the first molding surface. An inductor is formed to pass through the molding layer from the first molding surface to the second molding surface of the molding layer and is juxtaposed to a sidewall surface of the semiconductor die.

Figure 1:
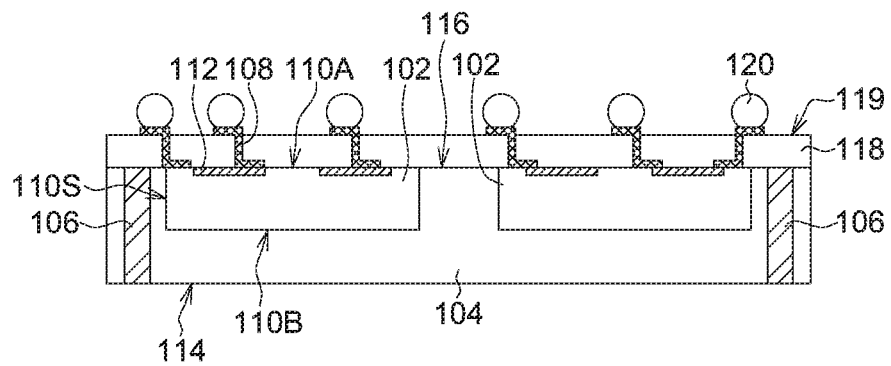
FIG. 1 illustrates a cross-section view of a semiconductor package structure according to an embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

In embodiments, an inductor and a semiconductor die are respectively disposed in non-overlapping regions of a molding layer. Therefore, the inductor can have a big size to provide a strong inductance performance, and the semiconductor die will not be affected by a crosstalk from the inductor. In addition, the redistribution layer is disposed in a level different from a level where the inductor is formed, and thus the redistribution layer can be arranged without considering a region area for the inductor, and can have more layout flexibility.

Embodiments are provided hereinafter with reference to the accompanying drawings for describing the related procedures and configurations. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily be drawn to scale. Thus, the specification and the drawings are to be regard as an illustrative sense rather than a restrictive sense.

FIG. 1 illustrates a cross-section view of a semiconductor package structure according to an embodiment. The semiconductor package structure may comprise a semiconductor die 102, a molding layer 104, an inductor 106 and a redistribution layer (RDL) 108. The semiconductor die 102 has an active surface 110A, a back surface 110B opposing to the active surface 110A, and a sidewall surface 110S between the active surface 110A and the back surface 110B. The active surface 110A may have a contact pad 112 thereon or therein. The molding layer 104 covers the back surface 110B and the sidewall surface 110S of the semiconductor die 102.

In embodiments, the semiconductor die 102 and the inductor 106 are disposed in non-overlapping regions of the molding layer 104, respectively. As shown in FIG. 1, the inductor 106 is disposed in the molding layer 104 on the sidewall surface 110S of the semiconductor die 102. Thus the semiconductor die 102 will not be affected by a crosstalk from the inductor 106. In addition, the inductor 106 can be designed to have a layout capable of generating a strong inductor performance. In an embodiment, for example, the inductor 106 has a thickness bigger than a thickness of the semiconductor die 102. The thickness of the semiconductor die 102 may be defined as a gap distance between the active surface 110A and the back surface 110B. In an embodiment, the thickness of the inductor 106 may be substantially equal to a thickness of the molding layer 104. For example, the thickness of the molding layer 104 may be defined as a gap distance between a first molding surface 114 and a second molding surface 116 opposing to the first molding surface 114 of the molding layer 104. The inductor 106 may extend between the first molding surface 114 and the second molding surface 116 of the molding layer 104.

Figure 2:
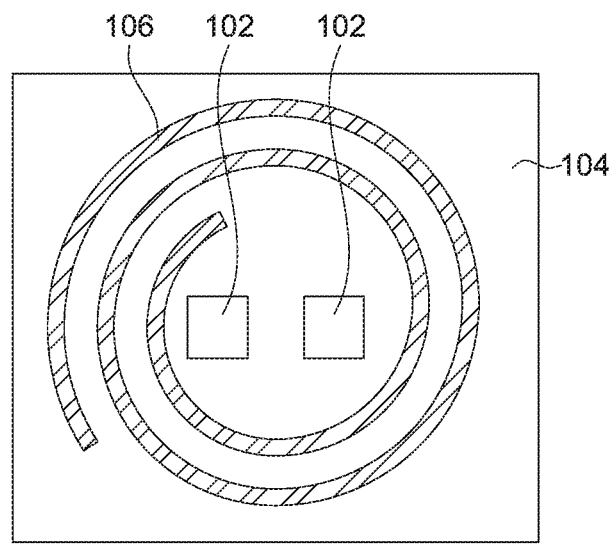
FIG. 2 illustrates a top view showing a molding layer, a semiconductor die, and an inductor according to an embodiment.
Figure 3:
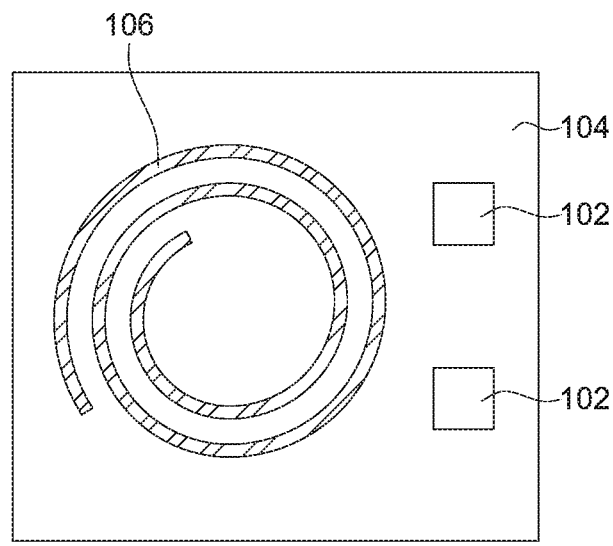
FIG. 3 illustrates a top view showing a molding layer, a semiconductor die, and an inductor according to another embodiment.

In embodiments, the inductor 106 can be arranged into an arbitrary pattern relating to the semiconductor die 102. For example, referring to FIG. 2 illustrating a top view of the semiconductor die 102 and the inductor 106 in the molding layer 104 according to an embodiment, the inductor 106 has a spiral pattern surrounding the semiconductor die 102. Alternatively, referring to FIG. 3 illustrating a top view of the semiconductor die 102 and the inductor 106 in the molding layer 104 according to an another embodiment, the whole spiral pattern of the inductor 106 is disposed outside of the semiconductor die 102. In other embodiments, the inductor 106 may be designed with arbitrary quantity or shape in a suitable region according to actual demand. For example, the inductor 106 may have a circular spiral pattern, an oval-shaped spiral pattern, a rectangular spiral pattern, a hexagonal spiral pattern, an irregular-shaped spiral pattern, or other suitable shapes.

Referring to FIG. 1, the redistribution layer 108 may be disposed in an insulating layer 118 on the active surface 110A of the semiconductor die 102 and the second molding surface 116 of the molding layer 104. The redistribution layer 108 may be electrically connected to the contact pad 112 of the semiconductor die 102. The redistribution layer 108 may be electrically connected to the inductor 106. For example, the redistribution layer 108 may be used to electrically connect the semiconductor die 102 to the inductor 106 and electrically connect elements such as active devices formed in the semiconductor die 102. The redistribution layer 108 also have a contact end exposed on an upper surface 119 of the insulating layer 118 and providing an electrical connection point for an external device.

As shown in FIG. 1, the redistribution layer 108 and the inductor 106 are disposed on and under the second molding surface 116 of the molding layer 104, respectively. Therefore, the redistribution layer 108 can be arranged without considering the inductor 106, and can have more layout flexibility. In an embodiment, for example, the redistribution layer 108 may be disposed in a layout region overlapping a layout region for the inductor 106. In an embodiment, the redistribution layer 108 has a layout region larger than a layout region for the semiconductor die 102, and has a fan-out arrangement.

In an embodiment, a solder material 120, such as a solder ball, may be disposed on the contact end of the redistribution layer 108 according to actual demand.

The semiconductor package structure may be manufactured by a method comprising a process flow as shown in FIG. 4 to FIG. 8 and FIG. 1 according to an embodiment.

Figure 4:
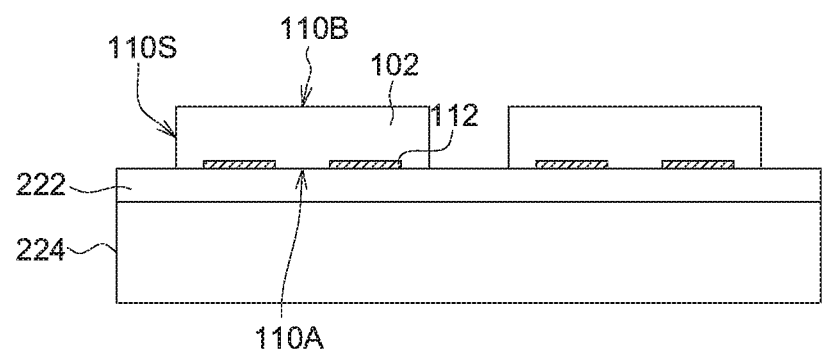
FIG. 4 to FIG. 8 illustrate a manufacturing method for a semiconductor package structure according to an embodiment.

Referring to FIG. 4, the semiconductor die 102 may be disposed on a carrier 224 with an adhesive layer 222 therebetween with the active surface 110A facing toward the carrier 224.

In an embodiment, for example, the semiconductor die 102 is a die formed by forming various IC elements on a front surface of a wafer as a semiconductor substrate by a semiconductor integrated circuit (IC) process, and then dicing the wafer finally. In other words, the sidewall surface 110S of the semiconductor die 102 may be a cut surface formed by cutting along a scribe line of the wafer. In embodiments, the semiconductor die 102 may be referred to as a semiconductor IC die. In an embodiment, for example, the semiconductor die 102 may comprise a logic IC die, a power IC die, etc.

Figure 5:
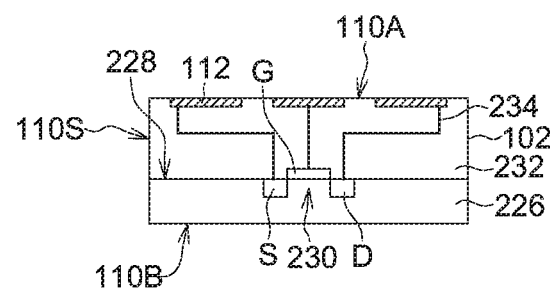

For example, FIG. 5 shows a cross-section view of the semiconductor die 102. An IC manufacturing process may be performed to form an active element 230 on a front substrate surface 228 opposing to the back surface 110B of a semiconductor substrate 226. For example, the active element 230 may comprise a MOS comprising a source S, a drain D and a gate G. In addition, an interconnect element 234 passing through a dielectric layer 232 is formed to electrically connect to the active element 230 and the contact pad 112 exposed by the dielectric layer 232. The interconnect element 234 may comprise at least one contact via, a plurality of conductive lines formed in interlayer/inter-metal dielectric films of the dielectric layer 232, a contact plug, etc. Finally, the wafer is diced into the semiconductor die 102.

Figure 6:
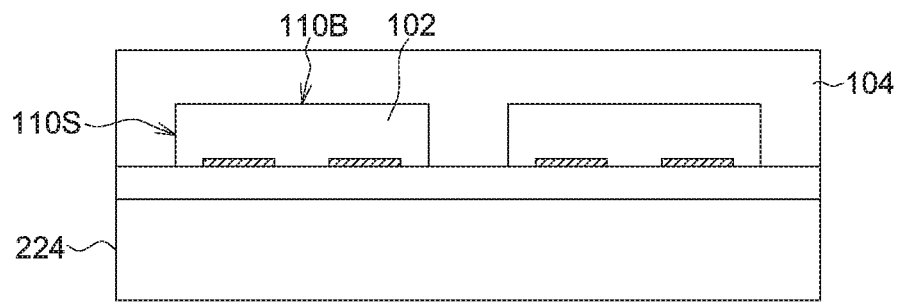

Referring to FIG. 6, the molding layer 104 is formed to cover the back surface 110B and the sidewall surface 110S of the semiconductor die 102. The carrier 224 may be covered by the molding layer 104. For example, the molding layer 104 may comprise epoxy, polyimide (PI), phenolic, silicone, or a combination thereof.

Figure 7:
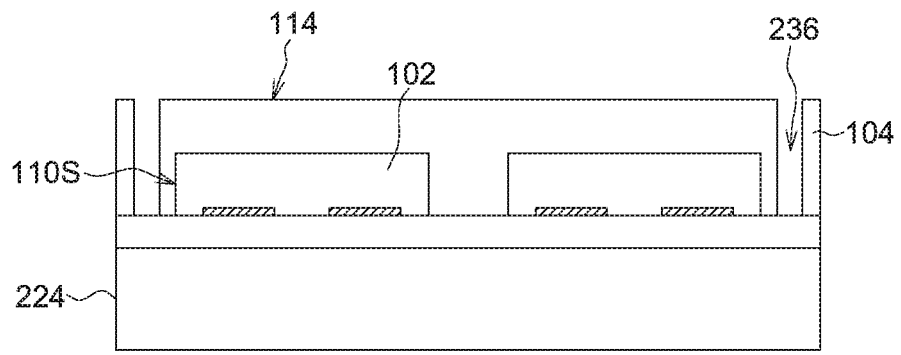

Referring to FIG. 7, a portion of the molding layer 104 on the sidewall surface 110S of the semiconductor die 102 is removed to form a through hole 236. The through hole 236 for example has a pattern for inductor when viewed in a top view such as the inductor pattern shown in FIG. 2 or FIG. 3. For example, the molding layer 104 may be removed from the first molding surface 114 by a laser method until the carrier 224 is exposed.

Figure 8:
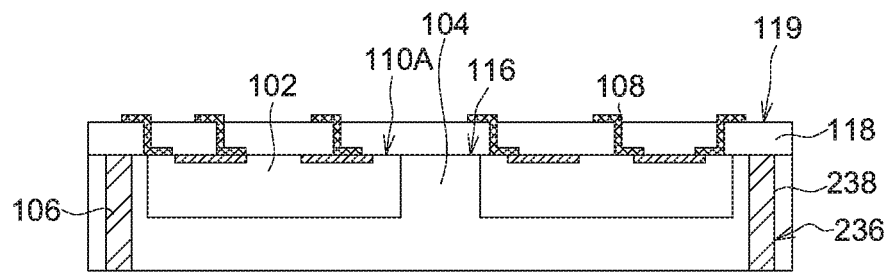

Referring to FIG. 8, next, the carrier 224 is removed. A conductive layer 238 may be filled in the through hole 236 to form the inductor 106 by an electrodeless plating method. However, the present disclosure is not limited thereto. In other embodiments, the conductive layer 238 may be formed in the through hole 236 by other suitable methods. The carrier 224 may be removed after forming the conductive layer 238. For example, the conductive layer 238 may comprise copper or other suitable conductive materials.

Referring to FIG. 8, the redistribution layer 108 is formed. The redistribution layer 108 may extend from the active surface 110A of the semiconductor die 102 and the inductor 106 onto the second molding surface 116 of the molding layer 104. The redistribution layer 108 may extend from the active surface 110A of the semiconductor die 102, the inductor 106 and the second molding surface 116 of the molding layer 104, passing through the insulating layer 118, and arranged on the upper surface 119 of the insulating layer 118. The redistribution layer 108 may have a contact end exposed by the upper surface 119 of the insulating layer 118 and provided for an external device.

Referring to FIG. 1, in an embodiment, the solder material 120, such as a solder ball or other suitable contact structures, may be disposed on the contact end of the redistribution layer 108 according to actual demand.

Accordingly, in embodiments, the inductor and the semiconductor die are respectively disposed in non-overlapping regions of the molding layer. Therefore, the inductor can have a big size to provide a strong inductance performance, and the semiconductor die will not be affected by a crosstalk from the inductor. In addition, the redistribution layer is disposed in a level different from a level where the inductor is formed, and thus the redistribution layer can be arranged without considering a region area for the inductor, and can have more layout flexibility.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package structure, comprising:
   a semiconductor die comprising an active surface, a back surface and a sidewall surface between the active surface and the back surface, wherein the active surface of the semiconductor die has a contact pad therein;
   a molding layer covering the back surface and the sidewall surface of the semiconductor die; and
   an inductor in the molding layer, wherein the sidewall surface of the semiconductor die faces toward the inductor, wherein a lower surface of the molding layer is coplanar with a lower surface of the inductor, and wherein an upper surface of the contact pad is coplanar with an upper surface of the inductor.

2. The semiconductor package structure according to claim 1, wherein the sidewall surface of the semiconductor die is an outer sidewall surface of the semiconductor die.

3. The semiconductor package structure according to claim 1, wherein the inductor is adjoined with the molding layer.

4. The semiconductor package structure according to claim 1, wherein the inductor has a thickness larger than a gap distance between the active surface and the back surface of the semiconductor die.

5. The semiconductor package structure according to claim 1, wherein a thickness of the inductor is equal to a thickness of the molding layer.

6. The semiconductor package structure according to claim 1, further comprising a redistribution layer (RDL) on the active surface of the semiconductor die.

7. The semiconductor package structure according to claim 1, wherein the molding layer adjoined with the inductor is adjoined with both the sidewall surface and the back surface of the semiconductor die.

8. The semiconductor package structure according to claim 1, wherein the inductor and the semiconductor die are non-overlapping.

9. The semiconductor package structure according to claim 1, further comprising a redistribution layer on the active surface of the semiconductor die, wherein the inductor is electrically connected to the semiconductor die through the redistribution layer and the contact pad.

10. A semiconductor package structure, comprising:
    a molding layer having a first molding surface and a second molding surface opposing to the first molding surface;
    a semiconductor die having an active surface and being embedded in the molding layer, wherein the active surface of the semiconductor die has a contact pad therein;
    an inductor extending through the molding layer from the first molding surface to the second molding surface of the molding layer, wherein a lower surface of the molding layer is coplanar with a lower surface of the inductor, and wherein an upper surface of the contact pad is coplanar with an upper surface of the inductor; and
    a redistribution layer extending from the active surface of the semiconductor die and the second molding surface of the molding layer in a direction away from the first molding surface of the molding layer.

11. The semiconductor package structure according to claim 10, wherein the first molding surface is one of an upper surface and the lower surface of the molding layer, the second molding surface is the other of the upper surface and the lower surface of the molding layer.

12. The semiconductor package structure according to claim 10, wherein the inductor extends through the molding layer on a sidewall surface of the semiconductor die and extends beyond a back surface of the semiconductor die, the sidewall surface is between the back surface and the active surface of the semiconductor die.

* * * * *